US005212345A

United States Patent [19]

Gutierrez

[11] Patent Number: 5,212,345

[45] Date of Patent: May 18, 1993

[54] SELF LEADED SURFACE MOUNTED COPLANAR HEADER

[75] Inventor: Aurelio J. Gutierrez, San Diego, Calif.

[73] Assignee: Pulse Engineering, Inc., San Diego, Calif.

[21] Appl. No.: 825,148

[22] Filed: Jan. 24, 1992

[51] Int. Cl.[5] ........................ H01L 23/02; H01R 9/00; H01F 27/02

[52] U.S. Cl. .................................. 174/52.5; 174/52.1; 361/394; 361/400; 361/404; 361/405; 336/90

[58] Field of Search ............... 361/400, 401, 402, 403, 361/404, 405, 390, 392, 394; 174/52.1, 52.2, 52.3, 52.4, 52.5; 336/90, 92, 96, 98

[56] References Cited

U.S. PATENT DOCUMENTS 4,754,370 6/1988 Detizio et al. ...................... 361/404

*Primary Examiner*—Leo P. Picard

*Assistant Examiner*—Bot Ledynh

*Attorney, Agent, or Firm*—Baker, Maxham, Jester & Meador

[57] ABSTRACT

A self leaded header for surface mounting of a circuit element to a PC board comprises a generally box-like support body having a cavity for mounting a circuit element, the support body having a base and a plurality of feet extending downward from the base for supporting the same on a PC board, a plurality of lead support members having a generally spool configuration extending generally horizontally outward from the support body adjacent the base, an inductance coil mounted in the cavity, and a lead extending from the coil to and wound multiple turns around each of the lead support members and disposed for surface bonding to a PC board.

17 Claims, 1 Drawing Sheet

SELF LEADED SURFACE MOUNTED COPLANAR HEADER

BACKGROUND OF THE INVENTION

The present invention relates to electronic component packaging, and pertains particularly to an improved package having self leaded coplanar header for improved surface mounting.

For many years, electronic circuit boards have been fabricated by interconnecting a plurality of electronic components, both active and passive, on a planar printed circuit board. Typically, this printed circuit board has comprised an Epoxy/fiberglass laminate substrate clad with a sheet of copper, which has been etched to delineate the conductive paths. Holes were drilled through terminal portions of the conductive paths for receiving electronic component leads, which were subsequently soldered thereto.

More recently, so-called surface mount technology has evolved to permit more efficient automatic mass production of circuit boards with higher component densities. With this approach, certain packaged components are automatically placed at preselected locations on top of a printed circuit board, so that their leads are registered with, and lie on top of corresponding solder paths. The printed circuit board is then processed by exposure to infrared or vapor phase soldering techniques to re-flow the solder and thereby establish a permanent electrical connection between the leads and their corresponding conductive paths on the printed circuit board.

The increasing miniaturization of electrical and electronic elements and high density mounting thereof has created increasing problems with electrical isolation and mechanical interconnection. In particular, it creates more difficulty establishing reliable and efficient connection between packaged components and egress hardware or terminals. Presently known interconnect methods severely limit the ability to provide density and reliable electrical and mechanical isolation between distinct egress or terminal points due to space limitations.

Among the electrical and electronic elements that must be surface mounted on PC boards are bi-filar wound cores used as inductors in circuits. These are preferably connected through some form of header or packaging with suitable terminals. The current technique of surface mounting of these and other similar components is by separate component lead terminals. Recent improvements have been made, such as disclosed in U.S. Pat. No. 5,015,981, issued May 14, 1991 to Lint et al, and U.S. Pat. No. 5,032,953, issued Jul. 16, 1991 to Carl et al, both assigned to the assignee hereof. These current techniques of mounting are time consuming, difficult to machine assemble, and frequently result in reliability problems.

It is, therefore, desirable that an improved package and method of mounting of miniature electronic components be available.

SUMMARY AND OBJECTS OF THE INVENTION

It is the primary object of the present invention to provide an improved package and method of mounting of electrical components.

In accordance with a primary aspect of the present invention, an electronic circuit header device having a plurality of leads comprises a three dimensional holder of a non-conducting material having a cavity therein for holding a circuit element, a plurality of leads extending from the element to the base, and a plurality of lead terminal mounts on the base of the holder, and each lead having an end portion wound on one of said lead terminal mounts.

BRIEF DESCRIPTION OF THE DRAWING

The above and other objects and advantages of the present invention will become apparent from the following description when read in conjunction with the accompanying drawings wherein.

DETAILED DESCRIPTION OF A PREFERRED EMBODIMENT

Figure 1:
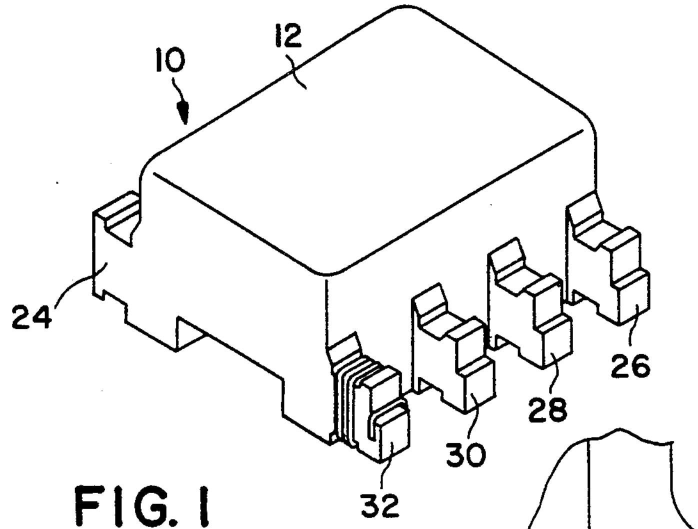
FIG. 1 is a perspective view illustrating a preferred embodiment of the invention.

Thus, from the above description, it is seen that I have a miniature electronic unit package for high density mounting, and an improved method of forming and assembling such a package.

Turning to the drawings, and particularly FIGS. 1-4, there is illustrated an exemplary embodiment of the present invention, designated generally by the numeral 10. The invention comprises a self leaded surface mounted coplanar header for simple and easy surface mounting on PC boards. The term header may be used herein interchangeably with the term housing.

The header, designated generally by the numeral 10, comprises a body 12 having a generally rectangular box-like configuration for holding an electrical or electronics component, and providing termination for leads for the electrical component. The body is formed, such as by molding out of a suitable material, such as a liquid crystal polymer, preferably XYDAR available from Amoco Company. The body is formed with a cavity 14, which in this instance is in the underside for receiving bi-filar wound toroidal core 16. This circuit element has multiple reverse section windings on a toroidal core providing a special inductor. These cores and their construction are disclosed in U.S. Pat. No. 4,548,365, which is incorporated herein by reference as though fully set forth.

The body is formed of a plurality of lead termination blocks or support members 18, 20, 22, 24, 26, 28, 30 and 32 extending outwardly from opposite sides at the base thereof. These lead termination support members have a generally spool configuration, with opposed upper shoulders 34 and 36, and opposed lower shoulders 38 and 40 for retaining wound leads thereon. A lead from one end of each coil on core 16 extends to and terminates as a winding of up to about three turns on each termination support member 18-32.

Figure 5:
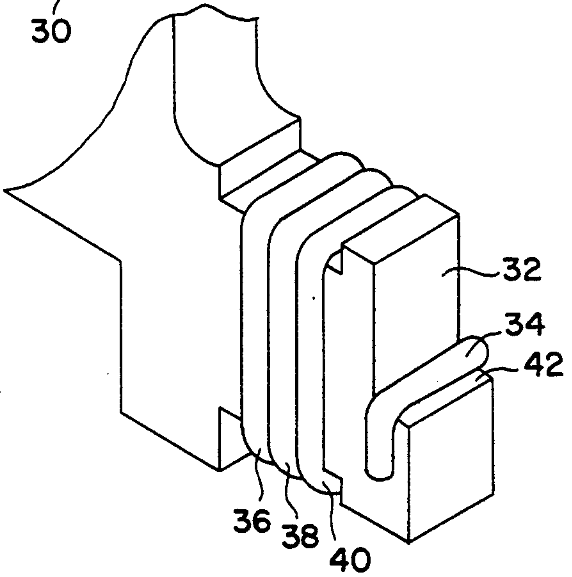
FIG. 5 is an enlarged view of a terminal member.
Figure 2:
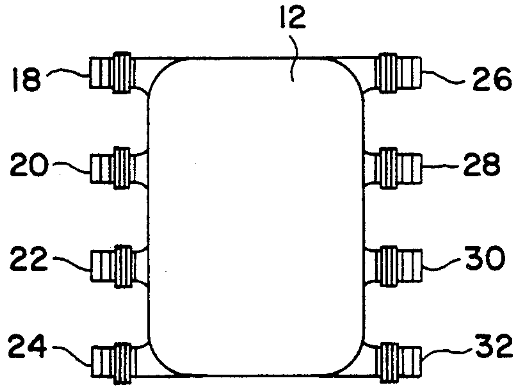
FIG. 2 is a top plan view of the embodiment of FIG. 1.

Referring specifically to FIG. 5, an enlarged view of one of the terminal members 32 is illustrated. As seen, a lead wire 34 is wrapped around several (three) turns on the spool structure, forming three downward extending projection 36, 38 and 40. The terminal end of the lead 34 extends across and is crimped onto an upwardly directed shoulder 42 on the outer end of the terminal member. This supports the termination of the lead in a position to be soldered to the PC board pad. The leads are supported slightly above the surface of the PC board or conductor that it is to be bonded to.

Figure 3:
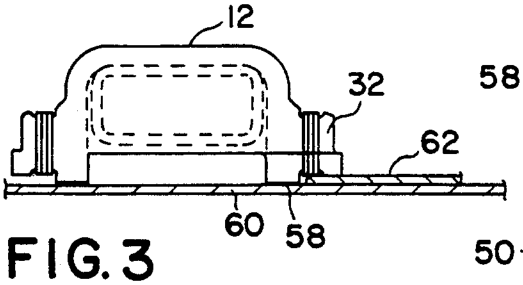
FIG. 3 is an end elevation view of the embodiment of FIG. 1.
Figure 4:
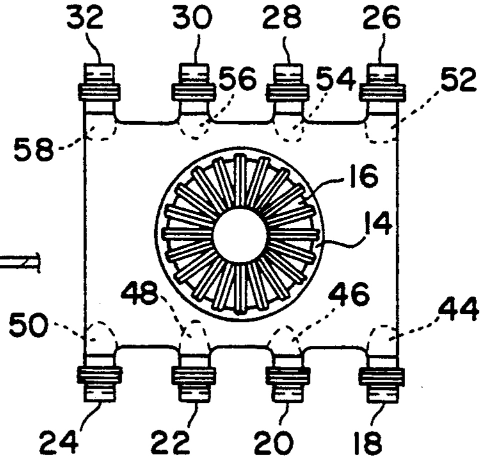
FIG. 4 is a view from below the embodiment of FIG. 1.

As can best be seen in FIGS. 3-5, the body member 12 is formed with a plurality of downwardly depending feet or support pads 44, 46, 48, 50, 52, 54, 56 and 58. These directly engage the surface of a PC board 60 and support the body 12 on the PC board, without the necessity of its resting on (i.e. independent of) the lead terminals. The lead terminals, as seen in FIG. 3, will be spaced a slight amount, such as on the order of about two to four thousandths of an inch above the surface of the solder pads (only one shown) 62 on the PC board 60. The solder pads 62 on the PC board 60 will be pretreated with solder paste, with a layer of about eight to ten thousandths of an inch in thickness.

In assembling the unit, the toroidal core is wound with a suitable number of windings, which in the illustrated embodiment would be four windings and mounted within the cavity 12. The terminal end of each of the windings is extended to and wrapped around selected pairs of the terminal support members, as illustrated in FIGS. 2-5. The cavity 14 may be filled with a plastic material, covering and encapsulating the coil unit 16, and forming a smooth surface box-like package. The terminal members are then dipped in a solder hot enough to melt the insulation therefrom and tin coat the terminal leads. The unit is then placed in an appropriate position on a PC board, with the lead terminals disposed over solder pads which have been pretreated with a solder paste, and are bonded in place by reflow of the solder and solder paste. This construction eliminates the need for lead frames and terminals pins. It is also simple, easy and inexpensive to construct.

Thus, from the above, it will be seen that I have provided a simple and inexpensive header unit that can be simply and easily manufactured and quickly and easily mounted on a PC board.

While I have illustrated and described my invention by means of specific embodiments, it should be understood that numerous changes and modifications may be made therein without departing from the spirit and scope of the invention as defined in the appended claims. I further assert and sincerely believe that the above specification contains a written description of the invention and the manner and process of making and using it, in such full, clear, concise, and exact terms as to enable any person skilled in the art to which it pertains, or with which it is most nearly concerned, to make and use the same, and further that it sets forth the best mode contemplated by me for carrying out the invention.

I claim:

1. A combination circuit element and self leaded header for surface mounting of the circuit element to a PC board, comprising:

a support body having a cavity for receiving an inductance coil, said body having a base for supporting same on a PC board;

a lead support member extending outward from said support body adjacent said base;

an inductance coil mounted in said cavity; and a lead extending from said inductance coil to said lead support member, wound multiple turns around said lead support member and disposed for surface bonding to a PC board.

2. A combination according to claim 1 wherein said lead support member extends generally horizontally outward from said base and has a generally spool like configuration.

3. A combination according to claim 1 wherein said support body has a plurality of said lead support members extending outward from said base.

4. A self leaded header according to claim 3 wherein said lead support members extend generally horizontally outward from opposite sides of said support body.

5. A combination according to claim 4 wherein a lead extends from said coil to each of said lead support members.

6. A combination circuit element and self leaded header for surface mounting of the circuit element to a PC board, comprising:

a support body for supporting a circuit element, said body having a base for supporting same on a PC board;

a lead support member extending outward from said support body adjacent said base;

a circuit element mounted on said support body; and a lead wire extending from said circuit element on said support body and wound multiple turns around said lead support member and disposed for surface bonding to a PC board, said circuit element comprising multiple coils wound on a common toroidal core and pairs of leads of each coil are wound on pairs of said lead support members.

7. A combination circuit element and self leaded header for surface mounting of the circuit element to a PC board, comprising:

a support body for supporting a circuit element, said body having a base for supporting same on a PC board;

a lead support member extending outward generally horizontally from opposite sides of said support body adjacent said base;

a circuit element mounted on said support body;

a lead wire extending from said circuit element on said support body and wound multiple turns around said lead support member and disposed for surface bonding to a PC board;

said lead support members have a shoulder on an outer end thereof; and said leads are each crimped across a shoulder of a respective one of said lead support members.

8. A combination circuit element and self leaded header for surface mounting of a circuit element to a PC board, comprising:

a support body for supporting a circuit element, said body having a base for supporting same on a PC board;

a plurality of lead support members extending outward generally horizontally from opposite sides of said support body adjacent said base said lead support members extend generally horizontally outward from said base and have a generally rectangular cross-sectional configuration with spaced apart opposed shoulders on an upper surface and a lower surface thereof;

a circuit element mounted on said support body; and a lead wire extending from said circuit element on said support body and wound multiple turns around said lead support member and disposed for surface bonding to a PC board.

9. A self leaded header according to claim 8 wherein said base has a plurality of feet extending downward for supporting engagement with a planar surface of a PC board; and said lead support members are disposed a distance above a support plane of said plurality of feet sufficient to overlie a solder pad in bonding relation thereto.

10. A self leaded header for surface mounting of a circuit element to a PC board, comprising:

a generally box-like support body for supporting a circuit element, said support body having a base and a plurality of feet extending downward from said base thereof for supporting the same on a PC board;

a plurality of lead support members extending generally horizontally outward from said support body adjacent said base and supported by said plurality of feet sufficient to overlie a solder pad on the PC board in bonding relation thereto; and said lead support members adapted to receive a lead wire extending from a circuit element on said support body and wound multiple turns around each of said lead support members and disposed for surface bonding to a solder pad on the PC board.

11. A self leaded header according to claim 10 wherein said lead support members have a generally spool like configuration.

12. A self leaded header for surface mounting of a circuit element to a PC board, comprising:

a generally box-like support body for supporting a circuit element, said support body having a base and a plurality of feet extending downward from said base thereof for supporting the same on a PC board;

a plurality of lead support members extending generally horizontally outward from both sides of said base and have a generally rectangular cross-sectional spool like configuration with spaced apart opposed shoulders on an upper surface and a lower surface thereof, said support members adapted to receive a lead wire extending from a circuit element on said support body and wound multiple turns around each of said lead support members and disposed for surface bonding to a PC board.

13. A self leaded header according to claim 12 wherein said lead support members have a shoulder on an outer end thereof; and said leads are each crimped across a shoulder of a respective one of said lead support members.

14. A self leaded header according to claim 12 wherein:

said circuit element is an inductance coil; and a lead extends from said coil to each of said lead support members.

15. A self leaded header according to claim 14 wherein:

said said support body includes a cavity for receiving said inductance coil; and said lead extends from said cavity to said lead support members.

16. A self leaded header according to claim 12 wherein said circuit element comprises multiple coils wound on a common toroidal core and pairs of leads of each coil are wound on pairs of said lead support members.

17. A combination circuit element and self leaded header for surface mounting of the circuit element to a PC board, comprising:

a generally box-like support body having a cavity for mounting a circuit element, said support body having a base and a plurality of feet extending downward from said base thereof for supporting the same on a PC board;

a plurality of lead support members having a generally spool like configuration extending generally horizontally outward from said support body adjacent said base;

a circuit element comprising multiple coils wound on a common toroidal core mounted in said cavity and pairs of leads of each coil are wound multiple turns on pairs of said lead support members disposed for surface bonding to a PC board;

said lead support members have a shoulder on an outer end thereof; and said leads are each crimped across a shoulder of a respective one of said lead support members.

* * * * *